United States Patent

Nakanishi et al.

[11] Patent Number: 5,722,062
[45] Date of Patent: Feb. 24, 1998

[54] LINEAR RECEIVER HAVING DUAL AUTOMATIC GAIN CONTROL LOOPS

[75] Inventors: Eiichi Nakanishi; Tetsuo Onodera, both of Tokyo, Japan

[73] Assignee: Oki Electric Industry Co., Ltd, Tokyo, Japan

[21] Appl. No.: 456,342

[22] Filed: Jun. 1, 1995

[30] Foreign Application Priority Data

Jun. 6, 1994 [JP] Japan ................................. 6-123601

[51] Int. Cl.$^6$ ............................................. H04B 1/16
[52] U.S. Cl. .................................. 455/247.1; 455/250.1; 455/311
[58] Field of Search ........................... 455/232.1, 234.1, 455/234.2, 246.1, 247.1, 250.1, 251.1, 252.1, 253.2, 254, 226.2, 280, 289, 291, 293, 283, 295, 296, 311; 348/678; 375/345; 330/129, 285

[56] References Cited

U.S. PATENT DOCUMENTS

| | | | |
|---|---|---|---|
| 4,186,351 | 1/1980 | Brefini et al. | 455/234.1 |
| 4,435,846 | 3/1984 | Weise | 455/252.1 |
| 4,541,122 | 9/1985 | Kimura | 455/252.1 |
| 4,553,105 | 11/1985 | Sasaki | 455/250.1 |
| 5,507,023 | 4/1996 | Suganuma et al. | 455/234.1 |
| 5,513,387 | 4/1996 | Saito et al. | 455/251.1 |

*Primary Examiner*—Nguyen Vo
*Attorney, Agent, or Firm*—Rabin, Champagne & Lynt, P.C.

[57] ABSTRACT

A linear receiver is disclosed which includes a linear receiver having: a preamplifier for amplifying linearly a modulated carrier signal (RF signal) having a first frequency trapped by an antenna; a mixer for converting the RF signal into an intermediate frequency signal having a second frequency less than the first frequency in accordance with a local oscillation signal; an IF stage for analogue delivering a demodulated output signal by saturatedly amplifying the intermediate frequency signal and for outputting an RSSI signal which indicates a level of the RF signal; an IF stage for digital incorporating therein an AGC input terminal for controlling an amplitude gain thereof for outputting an in-phase (I) signal and a quadrate (Q) signal, respectively, with the intermediate frequency signal by linearly amplifying the intermediate frequency signal; a first feed back loop circuit for providing a first feed back control signal to the AGC input terminal so as to keep demodulation levels of the I signal and the Q signal constant and not to be saturated; and a second feed back loop circuit for providing a second feed back control signal to the preamplifier and/or the mixer so as to keep the preamplifier and/or the mixer not to be saturated.

5 Claims, 8 Drawing Sheets

LINEAR RECEIVER HAVING DUAL AUTOMATIC GAIN CONTROL LOOPS

REFERENCE TO THE RELATED APPLICATION

This application claims the priority right under 35 U.S.C. 119, of Japanese Patent Application No. Hei 06-123601 filed on Jun. 6, 1994, the entire disclosure of which is incorporated herein by reference.

BACKGROUND OF THE INVENTION

1. Field of the Invention

The present invention relates to a linear receiver employing a heterodyne system and, more particularly, to a linear receiver applicable to a dual mode cellular mobile phone.

2. Description of the Related Art

An analogue FM system has been conventionally employed in a mobile communication in which a saturation type receiver has been used as an FM receiver on grounds that such a type of receivers can effectively eliminate a fading phenomenon and that an amplitude of an FM signal contains no communicable information.

However, a digital system has been recently employed to cope with an increase of users of the mobile communication, thereby replacing the analogue FM system by a linear modulation/demodulation system. Accordingly, a linear receiver in which a signal can be demodulated with its amplitude information being preserved or maintained.

Figure 1:
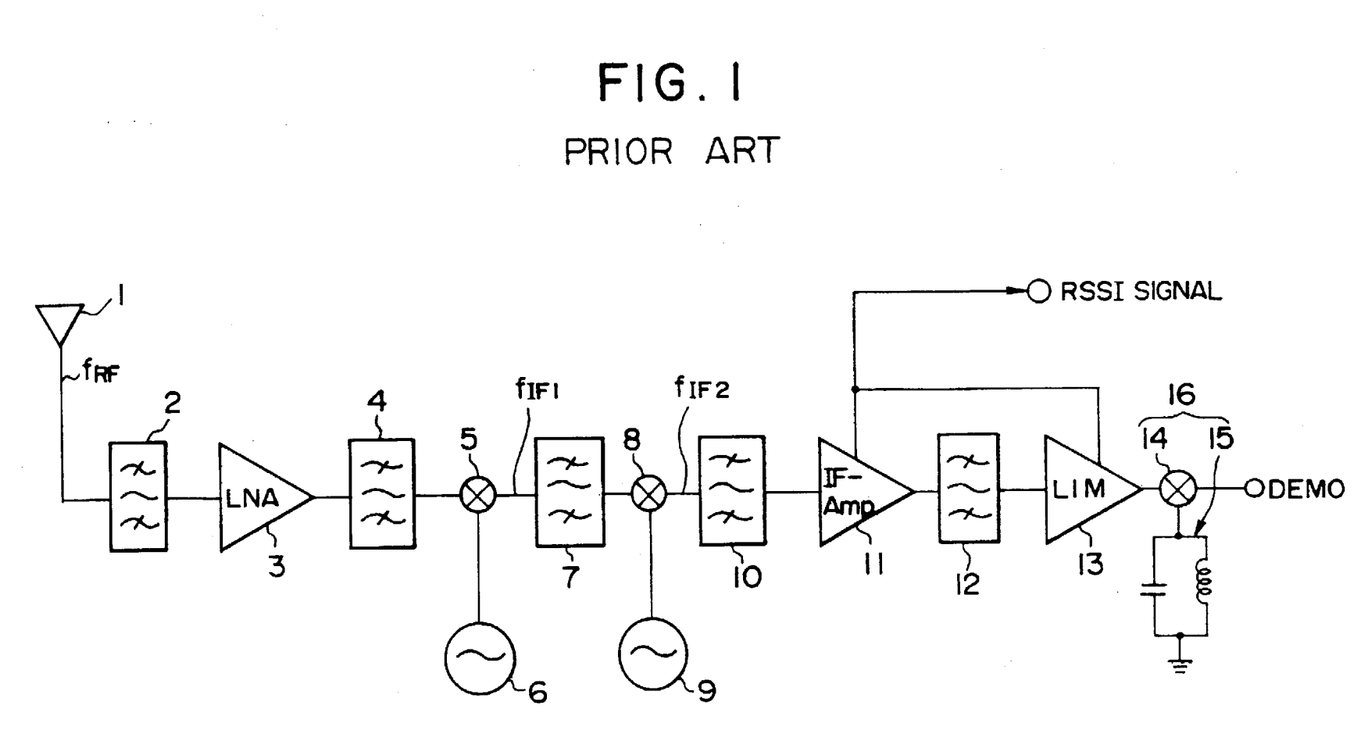
FIG. 1 is a block diagram illustrating a conventional saturation type analogue FM receiver.

The analogue FM system has used a limiter for eliminating an amplitude deviation of a received power level due to fading. FIG. 1 is a block diagram illustrating a conventional saturation type analogue FM receiver. A modulated carrier signal (RF signal) having a frequency $f_{RF}$ received by an antenna 1 is linearly amplified through a preamplifier (LNA) 3 and converted sequentially into the first intermediate frequency signal $f_{IF1}$ and the second intermediate frequency signal $f_{IF2}$ through the first mixer 5 and the second mixer 8, respectively, in accordance with local oscillation signals from the first and second local oscillators 6 and 9. The converted signal $f_{IF2}$ is further amplified through an intermediate frequency amplifier (IF-Amp) 11 and limited in amplitude by a limiter (LIM) 13. Then, the signal is input to a discriminator 16 consists of a multiplier 14 and a resonator 15 so that a demodulated audio output DEMO can be obtained through the discriminator 16.

Amplification amounted to 100 dB in amplitude is made through the intermediate frequency amplifier 11 and the limiter 13 to eliminate the deviation of amplitude due to the fading or the like and an RSSI signal which indicates a level of the received signal is output. The RSSI signal is provided, for example, as an information to prescribe a distance between a base station and the receiver to a transmission system and utilized as an instruction signal to change-over a transmission power in order to control the transmission power at a minimum as far as necessary. There is provided an optional number of band-pass filters 2, 4, 7, 10 and 12 between each of the processing stages in order only to provide the succeeding stage with a band width for which the succeeding stage can proceed.

Figure 2:
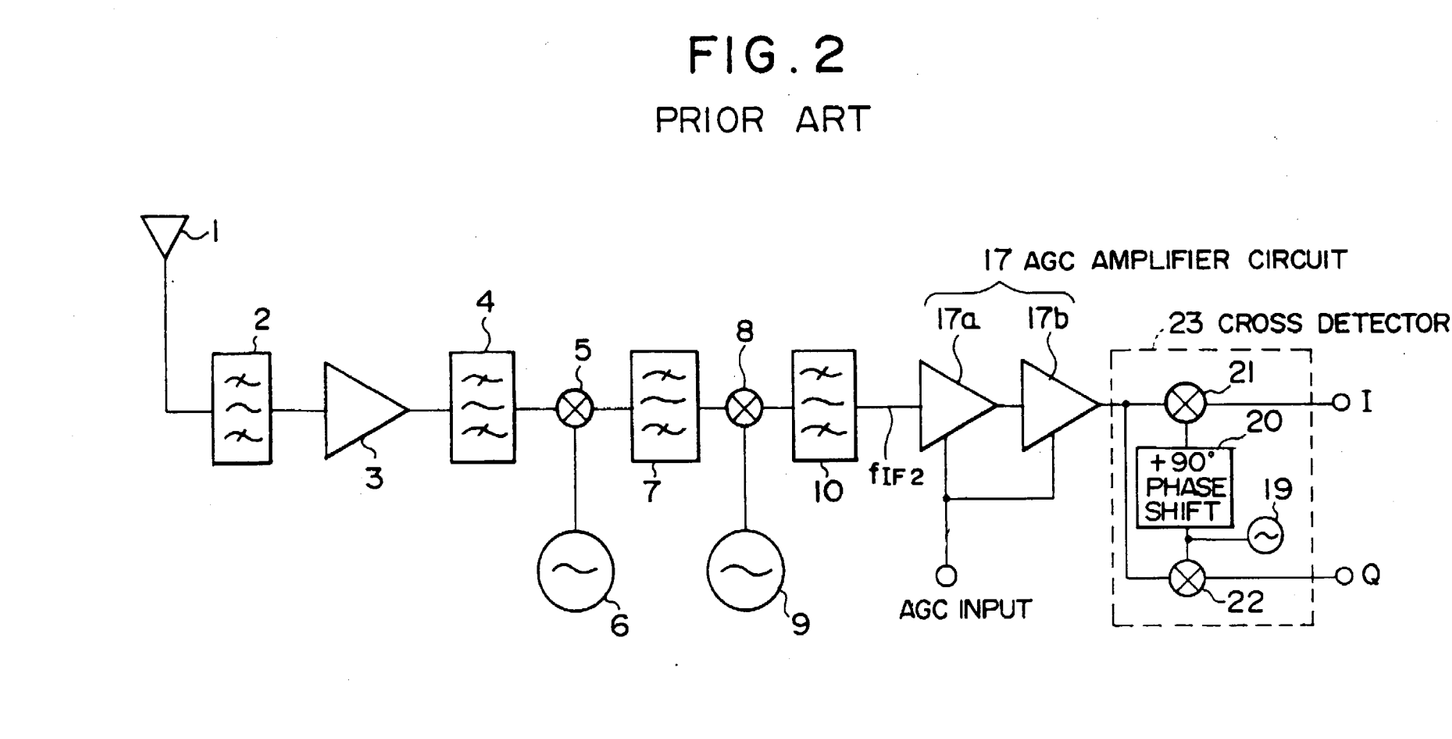
FIG. 2 is a block diagram illustrating a conventional digital linear receiver.

FIG. 2 is a block diagram illustrating a conventional digital linear receiver.

As shown in FIG. 2, a linear receiver for digital system (hereinafter referred as a digital linear receiver) reveals a big difference in structure as compared with that of the analogue FM receiver that an automatic gain control (AGC) amplifier circuit 17 and a cross detector 23 are provided in place of the intermediate frequency amplifier 11 and its successive stages.

The AGC amplifier circuit 17, which is constructed by connecting, for example, two amplifiers 17a and 17b in cascade, amplifies the intermediate frequency signal $f_{IF2}$ in such a manner to obtain a satisfactory output at the cross detector 23 and incorporates therein an AGC input terminal to control the amplitude gain. The cross detector 23, which is constituted of a local oscillator 19, +90° phase shifter 20, two mixers 21 and 22, and the like, outputs an in-phase (I) signal and a quadrature (Q) signal of the received signal. A next processing unit (not shown, see FIG. 7) subsequent to the cross detector 23 controls the AGC input voltage in accordance with the received signal level so that demodulation levels of the I signal and Q signal can be kept constant without saturated.

Figure 3:
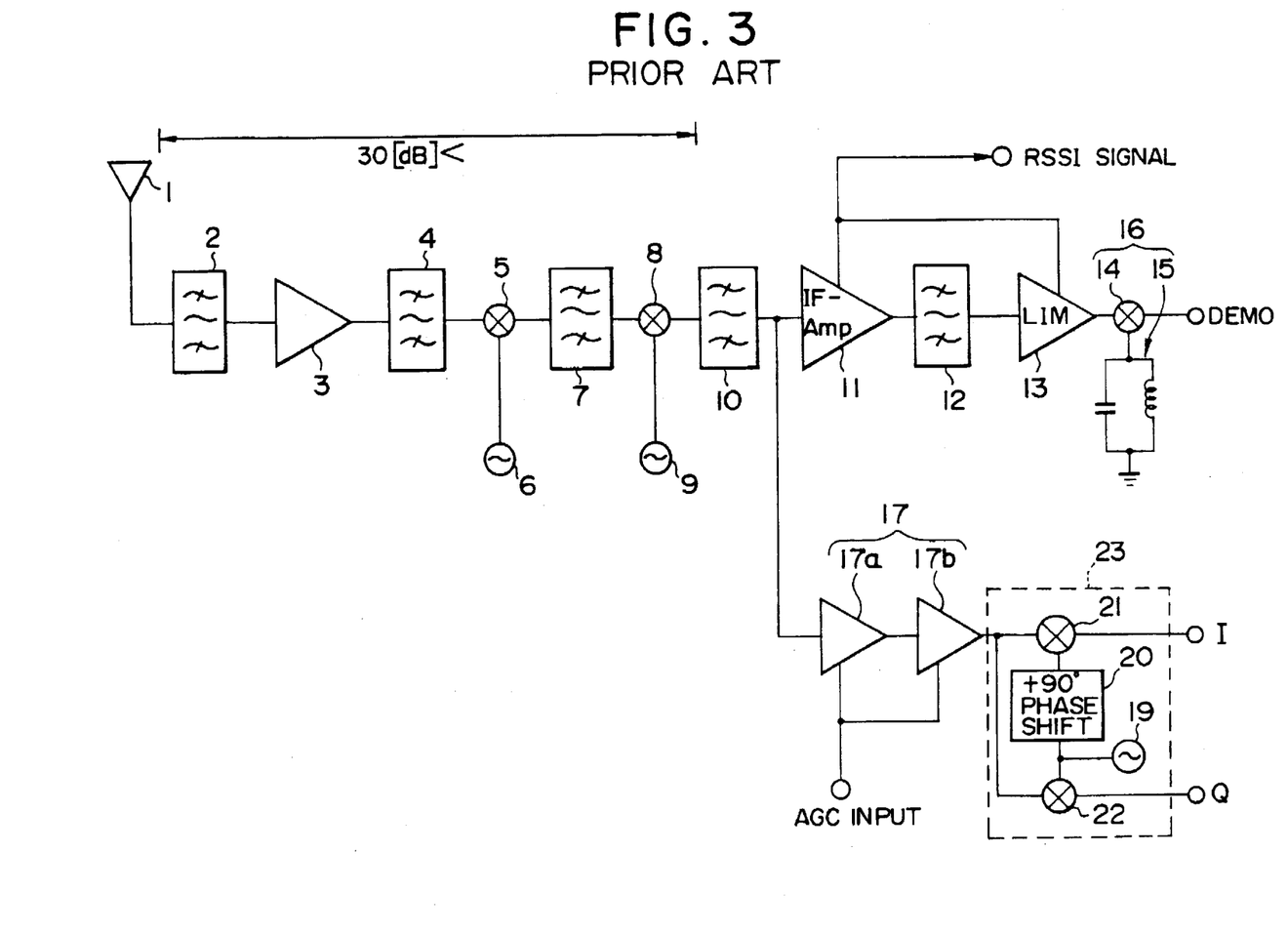
FIG. 3 is a block diagram illustrating a conventional dual mode receiver including a linear receiver.

By the way, there is a system in which a saturation type analogue FM receiver and a digital linear receiver should be combined into one unit which falls, for example, under a mobile subscriber unit (dual mode receiver) in the North American dual mode (analogue and digital) cellular telephone system. Since it may cause the unit to be magnified and cause the cost to be high that there is installed a receiver having two independent systems therein in the dual mode cellular mobile unit, processing stages 2~10 which obtain the second intermediate frequency signal $f_{IF2}$ are commonly utilized for both analogue and digital systems, and subsequent stages are separately utilized for each system as shown in FIG. 3.

If a gain distribution for each processing stage under such above receiver, however, is not properly made, there arises a problem that the receiver may be saturated in the following digital processing mode. In case, for example, the mobile unit is located near a base station, the received signal level of the mobile unit is fairly large enough actually to reach −30—−20 [dBm]. On the other hand, the gain obtained in the processing stages from an output terminal of the antenna 1 to the second mixer 8 exceeds 30 [dB] as shown in FIG. 3 so that the gain reaches 0 [dBm] at an output of the second mixer 8, thereby causing a usual device saturated when the mobile unit is located near the base station.

As mentioned above, the digital modulation/demodulation includes information in the amplitude component so that saturation of the receiver amplification system may eliminate such the amplitude information, causing errors in demodulation data. As a result, the device degrades its receiving characteristics.

SUMMARY OF THE INVENTION

The present invention, therefore, has an object the provision of a linear receiver enabling to avoid a receiving error by preventing saturation under high electric field (high input signal level) with a simplified circuit structure.

Another object of the present invention is to provide a linear receiver enabling to expand an AGC scope of the entire device.

To accomplish the above objects, there is provided a linear receiver which incorporates therein a preamplifier for amplifying linearly a modulated carrier signal (RF signal) having a first frequency trapped by an antenna; a mixer for converting the RF signal into an intermediate frequency signal having a second frequency less than the first frequency in accordance with a local oscillation signal; an IF stage for analogue delivering a demodulated output signal by saturatedly amplifying the intermediate frequency signal and for outputting an RSSI signal which indicates a level of the RF signal; an IF stage for digital incorporating therein an AGC input terminal for controlling an amplitude gain thereof for outputting an in-phase (I) signal and a quadrate (Q) signal, respectively, with the intermediate frequency signal by linearly amplifying the intermediate frequency signal; a first feed back loop circuit for providing a first feed back control signal to the AGC input terminal so as to keep demodulation levels of the I signal and the Q signal constant and not to be saturated; and a second feed back loop circuit for providing a second feed back control signal to the preamplifier and/or the mixer so as to keep the preamplifier and/or the mixer not to be saturated.

In the linear receiver according to the present invention, the higher the received signal level becomes, the smaller the gain of the radio frequency processing stage and/or the intermediate frequency processing stage is reduced to by the gain variable unit. As a result, the signal transmitted through the radio frequency processing stage and the intermediate frequency processing stage can be prevented from saturation so that the linear demodulation can be properly executed.

BRIEF DESCRIPTION OF THE DRAWINGS

By way of example and to make the description more clear, reference is made to the accompanying drawings in which like reference characters denote like parts in the various views.

DETAILED DESCRIPTION OF THE PREFERRED EMBODIMENTS

Hereinafter, a detailed description will be made as to the embodiment in which the present invention is applied to a dual mode receiver with reference to the attached drawings. A mobile subscriber unit of the North American TDMA digital cellular system corresponds, for example, to the dual mode receiver.

Figure 4:
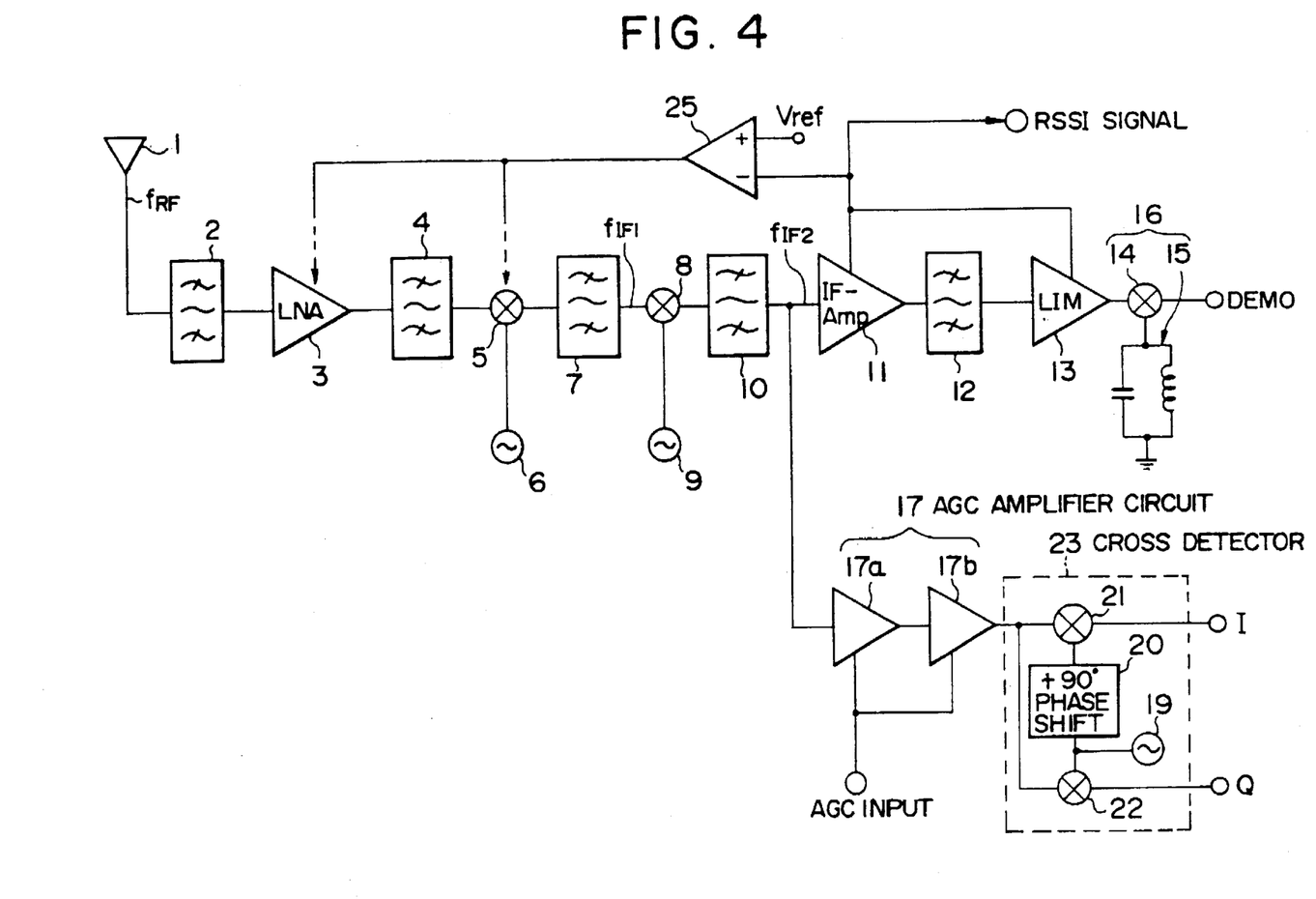
FIG. 4 is a block diagram illustrating a dual mode receiver including a linear receiver according to the embodiment of the present invention.
Figure 5:
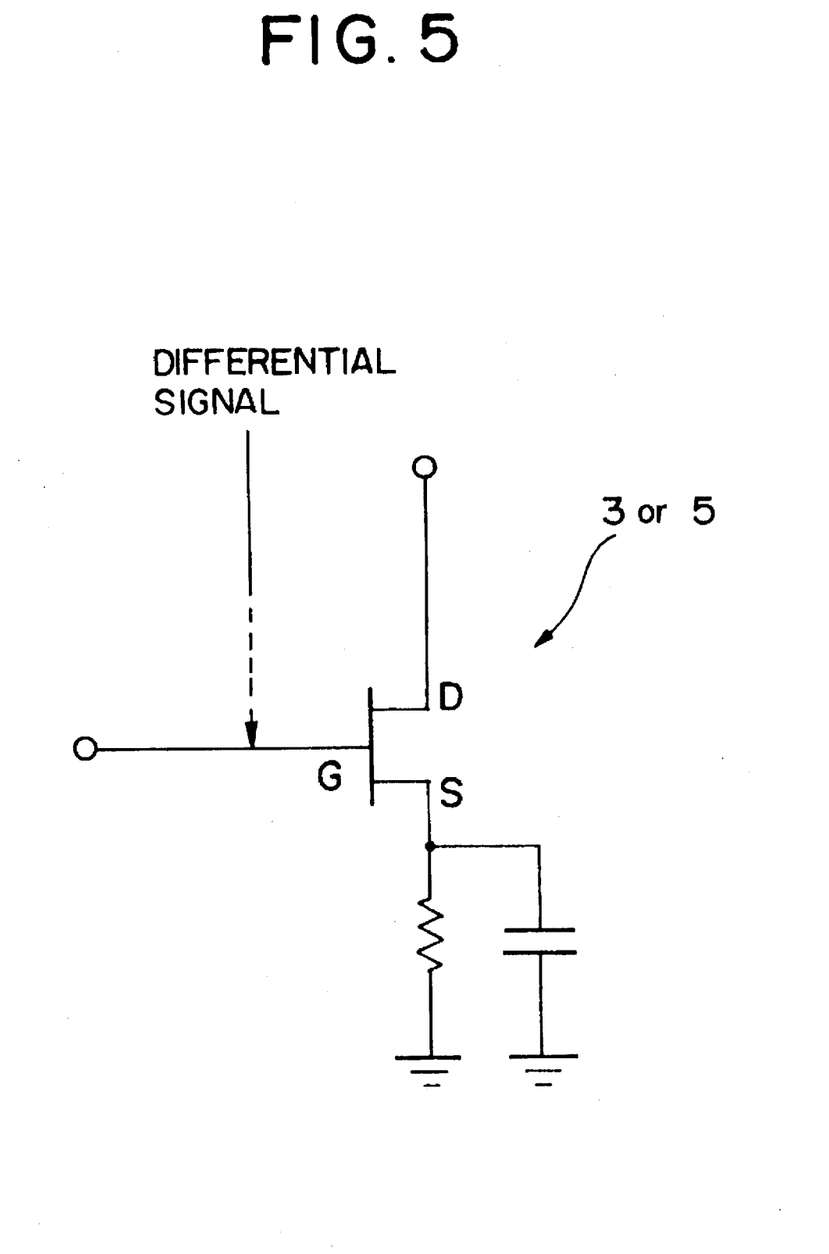
FIG. 5 is an explanatory view illustrating an amplifier element which performs a gain control.

FIG. 4 shows a dual mode receiver according to the embodiment of the present invention in which variable gain type ones are utilized as the preamplifier (LNA) 3 and/or the first mixer 5, and an operational amplifier structured differential amplifier 25 is, for example, disposed, which differs from the conventional dual mode receiver as shown in FIG. 1.

The differential amplifier 25 is constructed such that the RSSI signal from the intermediate frequency amplifier 11 and the limiter 13 is input to its inverted input terminal, a reference voltage Vref is input to its non-inverted input terminal, a differential signal is obtained from the RSSI signal indicating the current received signal level with reference to the reference voltage Vref, and the differential signal is provided to the preamplifier 3 and/or the first mixer 5 as a gain variable signal. Accordingly, the differential amplifier 25 is provided as a central component of the gain variable unit.

In case, for example, that the variable gain amplifier (the preamplifier 3 and/or the first mixer 5) is constituted of field effect transistor(FET)s, the differential signal should be fed back so as to vary a voltage (DC bias component) of a gate input terminal.

Now, a description will be made as to an operation of the dual mode receiver according to the present embodiment.

The RF signal $f_{RF}$ trapped at the antenna 1 passes through the band pass filter 2 so that only a received wave of the system is pass therethrough so as to be input to the preamplifier 3. The RF signal amplified by the preamplifier 3 up to a necessary level passes through the band pass filter 4 and is restricted in band width. Then, the RF signal is input to the first mixer 5 and multiplied with the local oscillation signal of the first local oscillator 6 so that its frequency is reduced to the first intermediate frequency signal $f_{IF1}$. The first intermediate frequency signal $f_{IF1}$ is restricted, in band width, to a predetermined amount set to the first intermediate frequency signal $f_{IF1}$ and input to the second mixer 8. The first intermediate frequency signal $f_{IF1}$ is further multiplied with the local oscillation signal of the second local oscillator 9 so that its frequency is reduced to the second intermediate frequency signal $f_{IF2}$. The second intermediate frequency signal $f_{IF2}$ is restricted, in band width, to a predetermined amount set to the second intermediate frequency signal $f_{IF2}$ and input to the processing stage (IF stage) for the intermediate frequency signal $f_{IF2}$.

The IF stage can be divided into an analogue system, i.e., a specific structure for an analogue FM receiver and a digital system, i.e., a special structure for a digital linear receiver.

The intermediate frequency signal $f_{IF2}$ input to the IF stage for analogue (saturated intermediate frequency processing stage) is amplified by the intermediate frequency amplifier 11, input to the band pass filter 12 so as to be restricted in band width, and input to the limiter 13. An amplitude deviation component caused by fading or the like of the intermediate frequency signal $f_{IF2}$ is eliminated by the limiter 13 and then detected by the frequency discriminator 16 so that a demodulated output DEMO is obtained.

The intermediate frequency amplifier 11 and the limiter 13 output the RSSI signal proportional to the received signal level at the antenna input terminal. The RSSI signal is provided to the differential amplifier 25 so as to obtain the differential signal (voltage signal) with reference to the reference voltage Vref and fed back to the preamplifier 3 and/or the first mixer 5.

Figure 6:
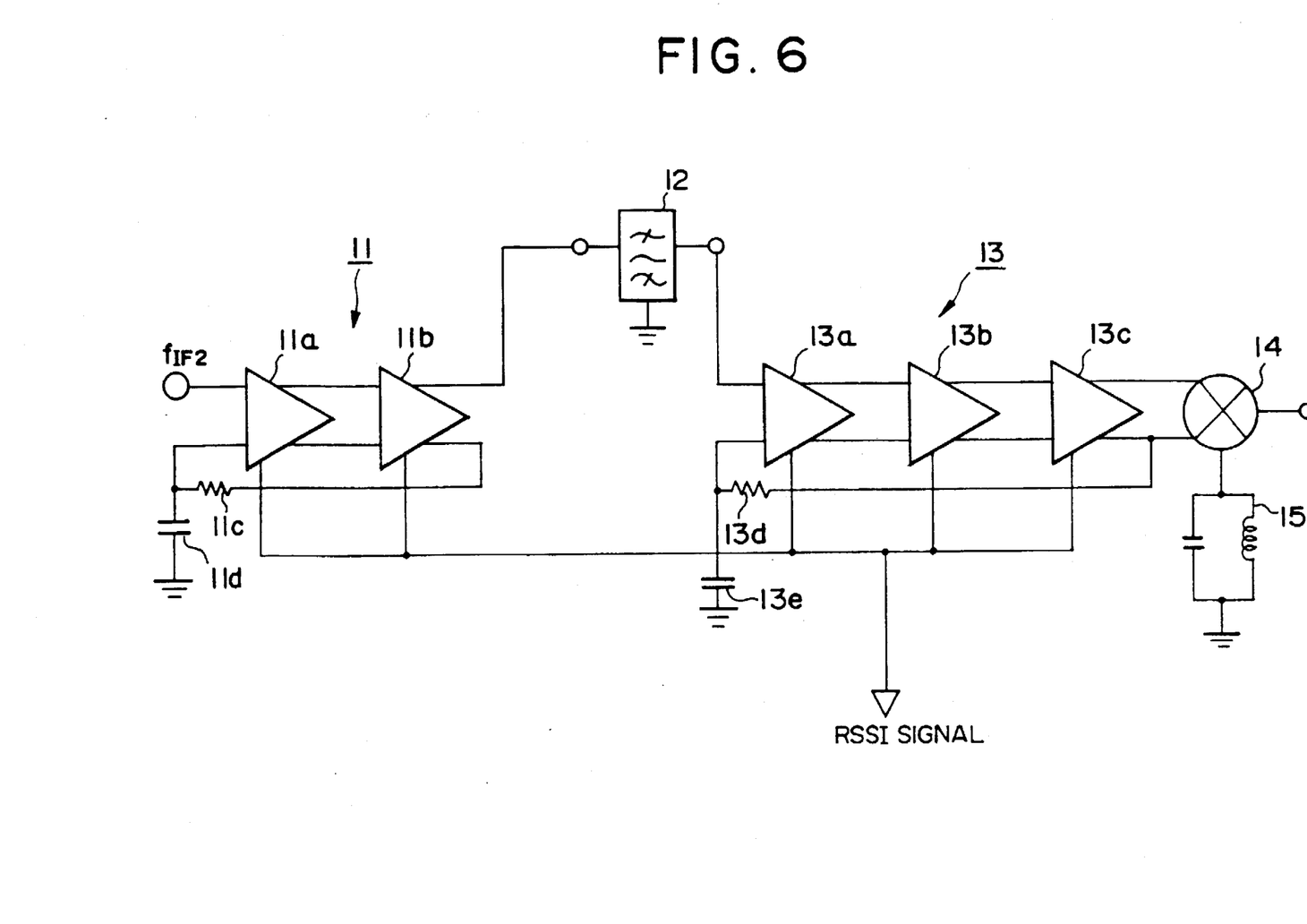
FIG. 6 is a block diagram illustrating a detailed structure of an intermediate frequency amplifier and a limiter which are utilized in a linear receiver according to the embodiment of the present invention.

FIG. 6 shows a detailed structural example of the intermediate frequency amplifier 11 and the limiter 13. In this example, the intermediate frequency amplifier 11 is constructed by connecting in cascade two differential amplifiers 11a and 11b having therein a feed back resistor 11c and a capacitor 11d for stabilizing the operational point and the limiter 13 is constructed by connecting in cascade three differential amplifiers 13a, 13b, and 13c having therein a feed back resistor 13d and a capacitor 13e for stabilizing the operational point. The RSSI signals provided from each of the differential amplifiers 11a, 11b, 13a, 13b and 13c are weighed and synthesized into a final RSSI signal.

On the other hand, the intermediate frequency signal $f_{IF2}$ input to the IF stage for digital is input to the AGC amplifier 17 and amplified by the AGC amplifier 17 in such a manner that the proper I and Q signals are obtained through the cross detector 23. In the cross detector 23, a local oscillation signal obtained by advancing the local oscillation signal of the local oscillator 19 with 90 degrees through the +90° phase shifter 20 is multiplied with the gain controlled intermediate frequency signal $f_{IF2}$ so that the I signal is achieved, whereas the local oscillation signal of the local oscillator 19 is multiplied with the gain controlled intermediate frequency signal $f_{IF2}$ so that the Q signal is achieved. The I and Q signals obtained in such above described manner are input to a decoder (not shown).

The AGC amplifier 17 incorporates thereinto an AGC input terminal which varies its gain so that the AGC input voltage which keeps demodulated I and Q signals to be a constant level so as not to be saturated is fed back by a controller of the device. In other words, the feed back operation is made such that the amplitudes of the I and Q signals are kept to be constant. Now hereinafter, a description will be made as to why the receiver, in particular, the IF stage for digital can be well protected against saturation even if the RF signal for digital has a high input level. If the input signal level from the antenna 1 becomes high, the second mixer 8 initiates, at first, to be saturated in accordance with the level diagram. The RSSI signal corresponding to the input signal is input to the inverted input terminal of the differential amplifier 25 and compared with the reference voltage Vref input to the non-inverted input terminal. The differential amplifier 25 functions such that the differential voltage is output therefrom only when the RSSI signal is larger than the reference voltage Vref. When the received signal level rises to a level at which the saturation is initiated, the RSSI signal becomes large enough to exceed the reference voltage Vref and the differential signal is effectively output from the differential amplifier 25 so as to be fed back to the preamplifier 3 and/or the first mixer 5. Thus, a feed back loop toward the preamplifier 3 and/or the first mixer 5 initiates its operation just when the received signal level rises and the RSSI signal becomes large enough to exceed the reference voltage Vref, which causes to reduce the gain of the preamplifier 3 and/or the first mixer 5.

In other words, a power level supplied to the second mixer 8 is kept constant in response to an increase of the received signal level. If the reference voltage Vref is set in such a manner that the input signal level of the second mixer 8 becomes proper, the signal level is attenuated by the preamplifier 3 and/or the first mixer 5 and input to the second mixer 8 even though the high level RF signal is input through the antenna 1, thereby preventing the saturation caused by the second mixer 8.

The prevention of the saturation caused by the second mixer 8 secures the linearity of the system up to the IF stage for digital. Accordingly, even though the RF signal for digital could be input, the intermediate frequency signal $f_{IF2}$ can be provided without loosing the amplitude information to the IF stage for digital, thereby correctly executing data demodulation.

Furthermore, the above embodiment has the following features which will be described hereinbelow with reference to a block diagram of FIG. 7 rewritten from FIG. 4.

Figure 7:
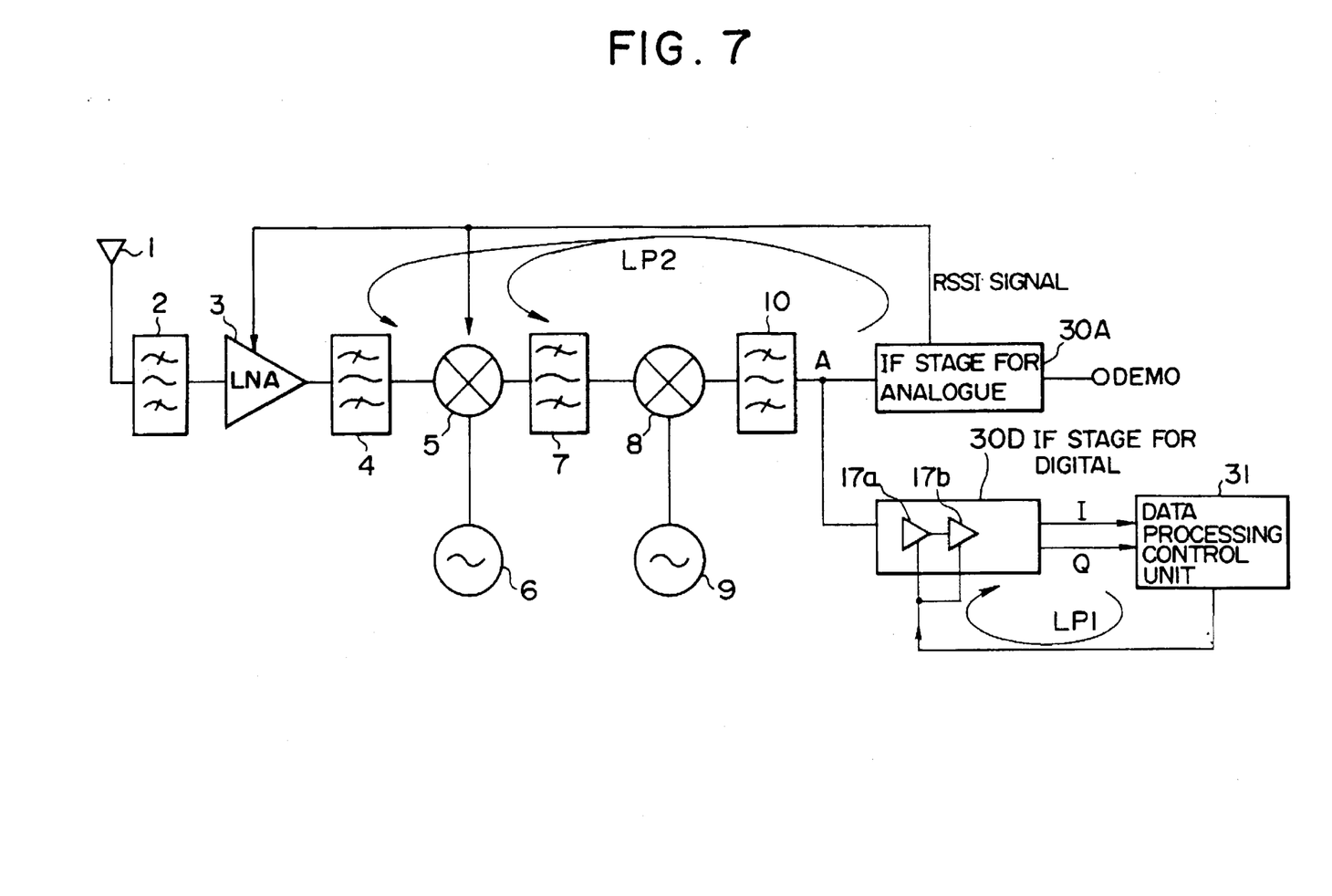
FIG. 7 is a block diagram illustrating a dual mode receiver shown in FIG. 4 rewritten such that a saturation protection loop can be clearly depicted.

A saturation preventing structure, i.e., an AGC structure, for a digital linear receiver is constituted, as shown in FIG. 7, of two loops LP1 and LP2, which features that each loop can operate independently.

The loop LP1 prevents occurrence of the saturation with the following loop function.

The I and Q signals output from the IF stage for digital 30D which is constituted of the AGC amplifier 17 and the cross detector 23 is input to the data processing control unit 31 including a demodulation structure or the like and demodulated. On this instance, the data processing control unit 31 generates the AGC voltage corresponding to the amplitudes of the I and Q signals and supplies it to the AGC amplifier 17 (each AGC amplifier 17a and 17b) on its AGC input terminal. Accordingly, the AGC loop LP1 controls the AGC amplifiers 17a and 17b in such a manner that the amplitudes of the I and Q signals are kept constant in spite of a signal level of the connection point A between the IF stage for digital 30D and the IF stage for analogue 30A.

On the other hand, the loop LP2 is constructed to be fed back to the front stages situated at the antenna side viewed from the connection point A in accordance with the RSSI signal output from the IF stage for analogue 30A constituted of the intermediate frequency amplifier 11, the band pass filter 12, the limiter 13, the frequency discriminator 16 and the like. A differential voltage, for example, from the reference voltage Vref is used as the feed back voltage. Under such above, the level of the intermediate frequency signal $f_{IF2}$ at the connection point A is suppressed less than a predetermined level so that the saturation is well prevented.

Accordingly, the loop LP2 can be independently designed from the loop LP1. In other words, a loop circuit design can be done in accordance with the gain vs control voltage characteristic of the preamplifier 3 and/or the first mixer 5.

Figure 8:
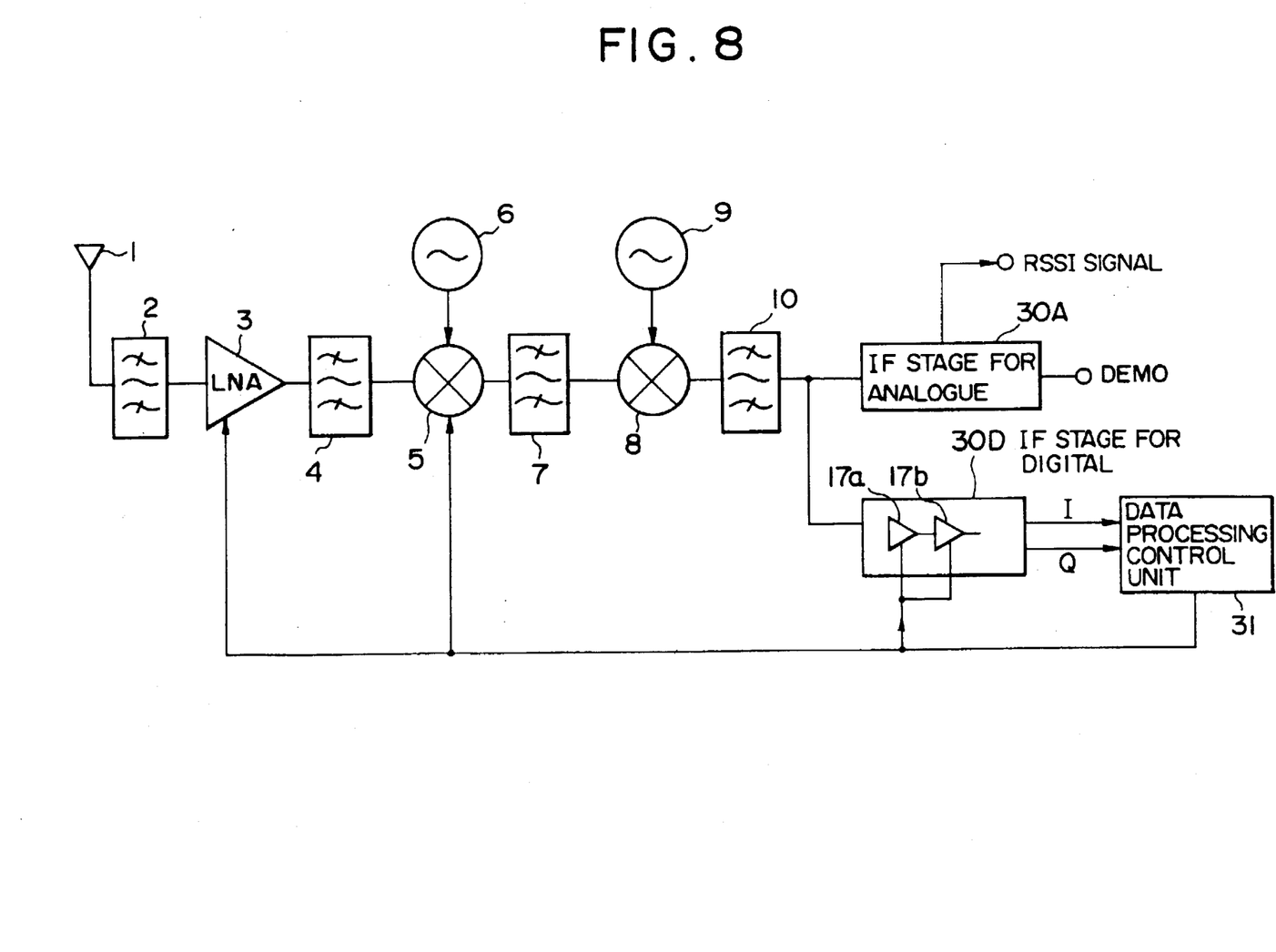
FIG. 8 is a block diagram of the linear receiver according to the embodiment of the present invention explaining an advantage of the embodiment.

As described above, since the above embodiment can choose its circuit constant or the like of the loops LP1 and LP2 independently with each other, each loops LP1 and LP2 can be easily optimized. Incidentally, it can be considered to construct the loop in such a manner that the control voltage (AGC voltage) from the data processing control unit 31 is provided not only to the AGC amplifier 17 but also to the preamplifier 3, the first mixer 5 or the like, for example, as shown in FIG. 8. However, since gain control sensitivities for the preamplifier 3, the first mixer 5 and the AGC amplifier 17 differ with each other, such a design to securely prevent the saturation caused by the second mixer 8 can not be so simplified but rather complicated. Accordingly, it would be rather preferable to employ the above embodiment.

According to the dual mode receiver of the above embodiment, since amplifier gains for common RF stages and IF stages can be controlled independently from the AGC control for the IF stages for digital in response to the RSSI signal from the IF stage for analogue (saturated intermediate frequency processing stage) 30A, it can be permitted to design in accordance with the gain control characteristic for each stage so that the saturation can be securely prevented.

As a result, even though the high level RF signal for digital system is input, the intermediate frequency signal $f_{IF2}$ can be provided, without loosing the amplitude information, to the IF stages for digital so that data demodulation can be correctly executed.

Although the embodiment shows a dual mode receiver for mobile communication, it is to be understood that the present invention is not limited to those but can be applied to a receiver not for use of mobile communication or a sole linear receiver without incorporating thereinto saturation receiver structure. In the latter case, detection and feed back structures can be supplemented to the conventional linear receiver.

Further, although the above described embodiments employ twice for frequency conversion, the present invention can be applied to a receiver in which frequency conversion having more than three times is employed. On this instance, the feed back operation is made to the mixer at an optimal position. The amplifier element to which the feed back operation is made is not limited to be in the preamplifier or the mixer. If there are employed intermediate frequency amplifiers between the mixers, the feed back operation can be achieved by decreasing the gains of those amplifiers.

What is claimed is:

1. A dual mode receiver, comprising:
   (a) a preamplifier for linearly amplifying a modulated RF signal having a first frequency, received by an antenna;
   (b) a mixer for converting the amplified RF signal into an intermediate frequency signal having a second frequency that is less than the first frequency, in accordance with a local oscillation signal;
   (c) an analogue IF stage for producing a demodulated output signal by saturatedly amplifying the intermediate frequency signal, and for outputting an RSSI signal which indicates a level of the RF signal;
   (d) a digital IF stage, including an AGC input terminal for controlling an amplitude gain thereof, for outputting an in-phase (I) signal and a quadrature (Q) signal with the intermediate frequency signal by linearly amplifying the intermediate frequency signal;
   (e) a first feed back loop circuit for providing a first feed back control signal, generated in accordance with demodulation levels of the I signal and the Q signal, to the AGC input terminal, so as to keep the demodulation levels of the I signal and the Q signal constant and not saturated; and
   (f) a second feed back loop circuit for feeding back the RSSI signal as a second feed back control signal to at least one of the preamplifier and the mixer, so as to keep the preamplifier and the mixer not saturated.

2. A dual mode receiver as set forth in claim 1, wherein the first feed back loop circuit operates independently from the second feed back loop circuit.

3. A dual mode receiver as set forth in claim 1, wherein the second feed back loop circuit is arranged so as to vary a gain of at least one of the preamplifier and the mixer.

4. A dual mode receiver as set forth in claim 3, wherein the second feed back loop circuit is arranged so as to vary a bias voltage supplied to at least one of the preamplifier and the mixer, in order to vary the gain of at least one of the preamplifier and the mixer.

5. A dual mode receiver as set forth in claim 1, wherein the second feed back loop circuit includes a differential amplifier, the differential amplifier including a first input terminal for receiving the RSSI signal; a second input terminal for receiving a reference voltage; and an output terminal for outputting the second feed back control signal.

* * * * *